(12) United States Patent
Maekawa

(10) Patent No.: US 6,681,312 B1
(45) Date of Patent: Jan. 20, 2004

(54) POWER SAVING ADDRESS TRANSLATION BUFFER

(75) Inventor: Tatsuya Maekawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/451,104

(22) Filed: Nov. 30, 1999

(30) Foreign Application Priority Data

Dec. 1, 1998 (JP) .......................................... 10-341588

(51) Int. Cl.$^7$ ............................................... G06F 12/10

(52) U.S. Cl. ........................ 711/207; 711/108; 711/128; 365/49

(58) Field of Search ................................ 711/207, 108, 711/128, 206, 202, 114; 365/49

(56) References Cited

U.S. PATENT DOCUMENTS 5,530,822 A * 6/1996 Beavers et al. ............. 711/207
5,535,351 A * 7/1996 Peng .......................... 711/207

FOREIGN PATENT DOCUMENTS

JP  63-81548   4/1988
JP  7-21785    1/1995

OTHER PUBLICATIONS

Japanese Office Action with English translation of pertinent portions dated Oct. 23, 2002.

* cited by examiner

Primary Examiner—Matthew Kim
Assistant Examiner—Matthew D. Anderson
(74) Attorney, Agent, or Firm—Whitman, Curtis & Christofferson, PC

(57) ABSTRACT

In an address translation buffer, multiple content-addressable memories of a first memory array store previous process identifiers for comparing them with a new process identifier to produce a first output signal when a coincidence is detected and a second output signal when a coincidence is not detected. Multiple drivers are associated respectively with the memories of the first memory array. Power saving of the drivers is achieved by having each driver pull up its output line as an indication of a match only when the first output signal of the associated memory coincides with a precharge signal and pull down its output line in response to a discharge signal when the associated memory subsequently produces the second output signal. Multiple content-addressable memories of a second memory array correspond respectively to the drivers. Each memory of the second array stores a previous virtual address and compares it with a new virtual address in response to the detection of the match from the corresponding driver to produce an output signal when a coincidence is detected between the previous and new virtual addresses. In response to the output signal from the second memory array a physical address is delivered from a third memory corresponding to the new process identifier.

7 Claims, 5 Drawing Sheets

POWER SAVING ADDRESS TRANSLATION BUFFER

BACKGROUND OF THE INVENTION

1. Field of the Invention

The present invention relates generally to address translation and more specifically to a translation lookaside buffer.

2. Description of the Related Art

In microprocessors, translation from a virtual address to a physical address is performed by an address translation buffer, called a translation lookaside buffer. This buffer has a first content-addressable memory array for comparison between previous process identifiers and a new process identifier for a first match and a second content-addressable memory array for comparison between previous virtual addresses and a new virtual address for a second match. When the first match is detected in one or more of the memories of the first memory array, those memories of the second memory array that correspond to the matched memories of the first memory array are triggered to execute a comparison between the previous virtual addresses and the new virtual address. In order to trigger the second memory array, a number of latches are provided for receiving output signals from corresponding memories of the first memory array and a corresponding number of drivers are connected to the outputs of the latches. When the comparison is being performed in the first memory array, all output lines of the drivers are pulled up to a high voltage level in response to a precharge signal. All output lines of the drivers are then pulled down to a low voltage level in response to a discharge signal except for those of the drivers where the corresponding latches have received output signals from the corresponding memories indicating the detection of the first match. The precharged states of the output lines where the first match is detected are maintained as match signals and used to trigger the second memory array for a match between virtual addresses.

Since all output lines of the drivers are pulled up to the precharge voltage regardless of the results of comparisons in the first memory array and those output lines where mismatch has occurred are then pulled down to the low voltage level, currents are discharged through the mismatched drivers. As a result, a substantial amount of energy is dissipated. Since this dissipated energy serves no purpose for the second memory array, a need exists to eliminate such lost energy.

SUMMARY OF THE INVENTION

It is therefore an object of the present invention to provide a power saving address translation buffer that eliminates waste of energy when there is no match between the process identifier of a currently executed process and a stored process identifier.

According to a first aspect, the present invention provides an address translation buffer comprising a first memory array having a plurality of content-addressable memories, each memory storing a previous process identifier for comparing the previous process identifier with a new process identifier which identifies a currently executed process and producing a first output signal when a coincidence is detected between the previous and new process identifiers and a second output signal when a coincidence is not detected. A plurality of drivers are associated respectively with the memories of the first memory array, each of the drivers having an output line and pulling the output line to a first voltage level only when the first output signal from the associated memory coincides with a precharge signal to produce a match signal and pulling the output line to a second voltage level in response to a discharge signal when the associated memory of the first memory array is producing the second output signal. A second memory array having a plurality of content-addressable memories is provided corresponding respectively to the drivers. Each memory of the second memory array stores a previous virtual address and compares it with a new virtual address corresponding to the new process identifier in response to the match signal of the corresponding driver. If a coincidence is detected between the previous and new virtual addresses, an output signal is supplied from that memory of the second memory array to a third memory from which a corresponding one of physical addresses is selected for output delivery.

Preferably, each of the drivers a coincidence gate for producing a coincidence output when the output signal of the associated memory of the first memory array coincides with the precharge signal, a first transistor responsive to the coincidence output for pulling the output line to the first voltage level, a second, normally conducting transistor responsive to the output signal of the associated memory of the first memory for changing to a non-conducting state, and a third transistor responsive to the discharge signal for pulling the output line to the low voltage level via the second transistor when the second transistor is conducting.

Preferably, a second driver is provided. The second driver has a plurality of output bit lines for pulling the output bit lines to different voltage levels corresponding to respective bits of the new virtual address and pulling the output bit lines to the low voltage level only when the output signal of at least one of the memories of the first memory array coincides with the discharge signal. Each memory of the second memory array is connected to the output bit lines for comparing the previous virtual address with the new virtual address represented by the different voltage levels from the second driver in response to the match signal of the corresponding.

According to a second aspect, the present invention provides an address translation buffer comprising a first memory array having a plurality of content-addressable memories, each memory storing a process identifier for comparing the process identifier with a process identifier which identifies a currently executed process and producing an output signal when a coincidence is detected between the process identifiers, a plurality of first drivers associated respectively with the memories of the first memory array, each of the drivers producing a match signal in response to the output signal from the associated memory of the first memory array, a second driver having a plurality of output bit lines for pulling the output bit lines to different voltage levels corresponding to respective bits of a new virtual address associated with the new process identifier, and pulling the output bit lines to the low voltage level only when the output signal of at least one of the memories of the first memory array coincides with the discharge signal, a second memory array having a plurality of content-addressable memories corresponding respectively to the first drivers, each memory of the second memory array being connected to the output bit lines of the second driver for storing a previous virtual address and comparing the previous virtual address with a new virtual address represented by the different voltage levels of the second driver in response to the match signal of the corresponding first driver and producing an output signal when a coincidence is detected between the previous and new virtual addresses, and a third memory for storing a plurality of physical addresses associated respectively with the memories of the second memory array and delivering one of the physical addresses in response to the output signal of the associated memory of the second memory array.

BRIEF DESCRIPTION OF THE DRAWINGS

The present invention will be described in further detail with reference to the accompanying drawings, in which.

DETAILED DESCRIPTION

Figure 1:
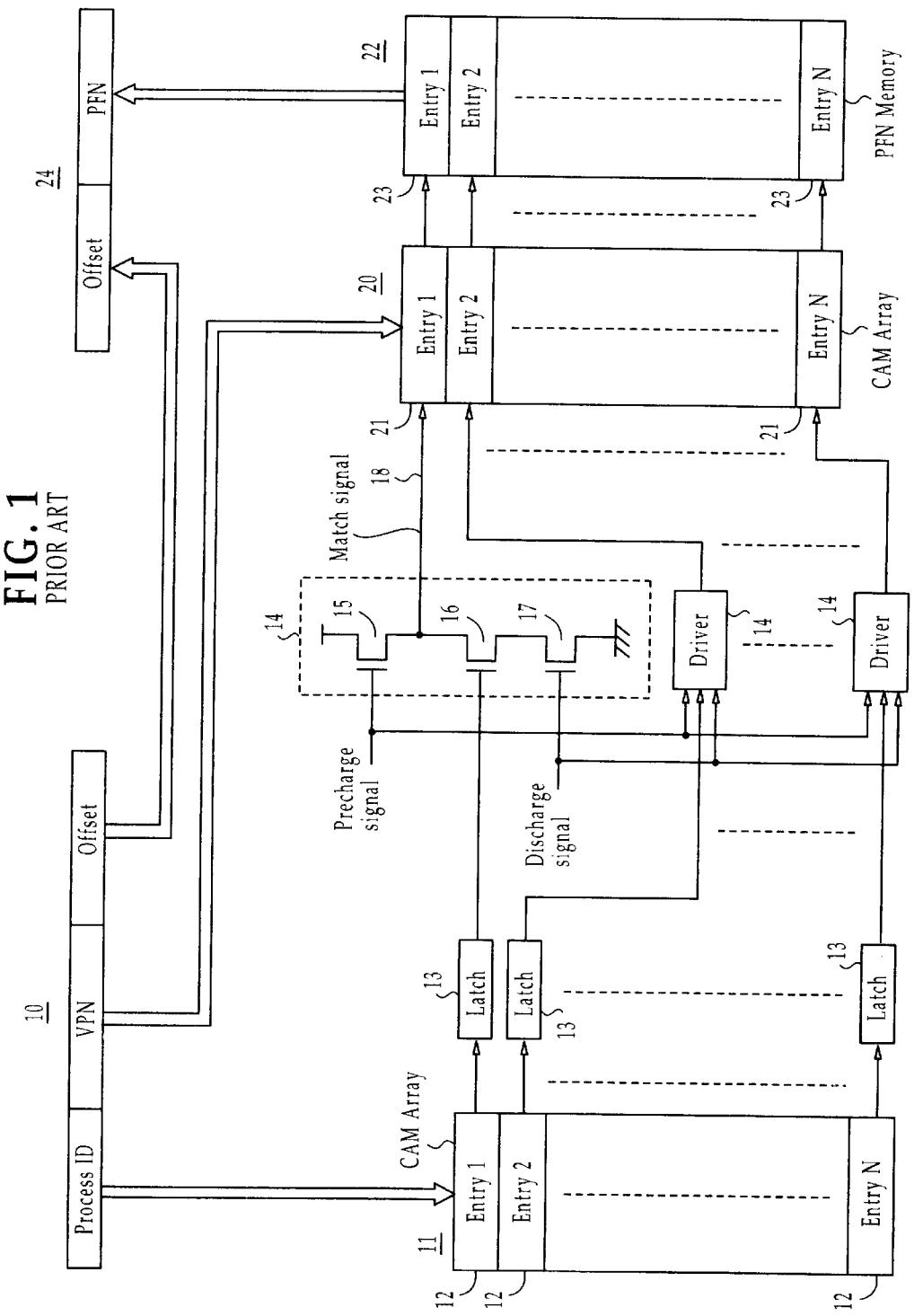
FIG. 1 is a block diagram of a first prior art translation lookaside buffer.
Figure 2:
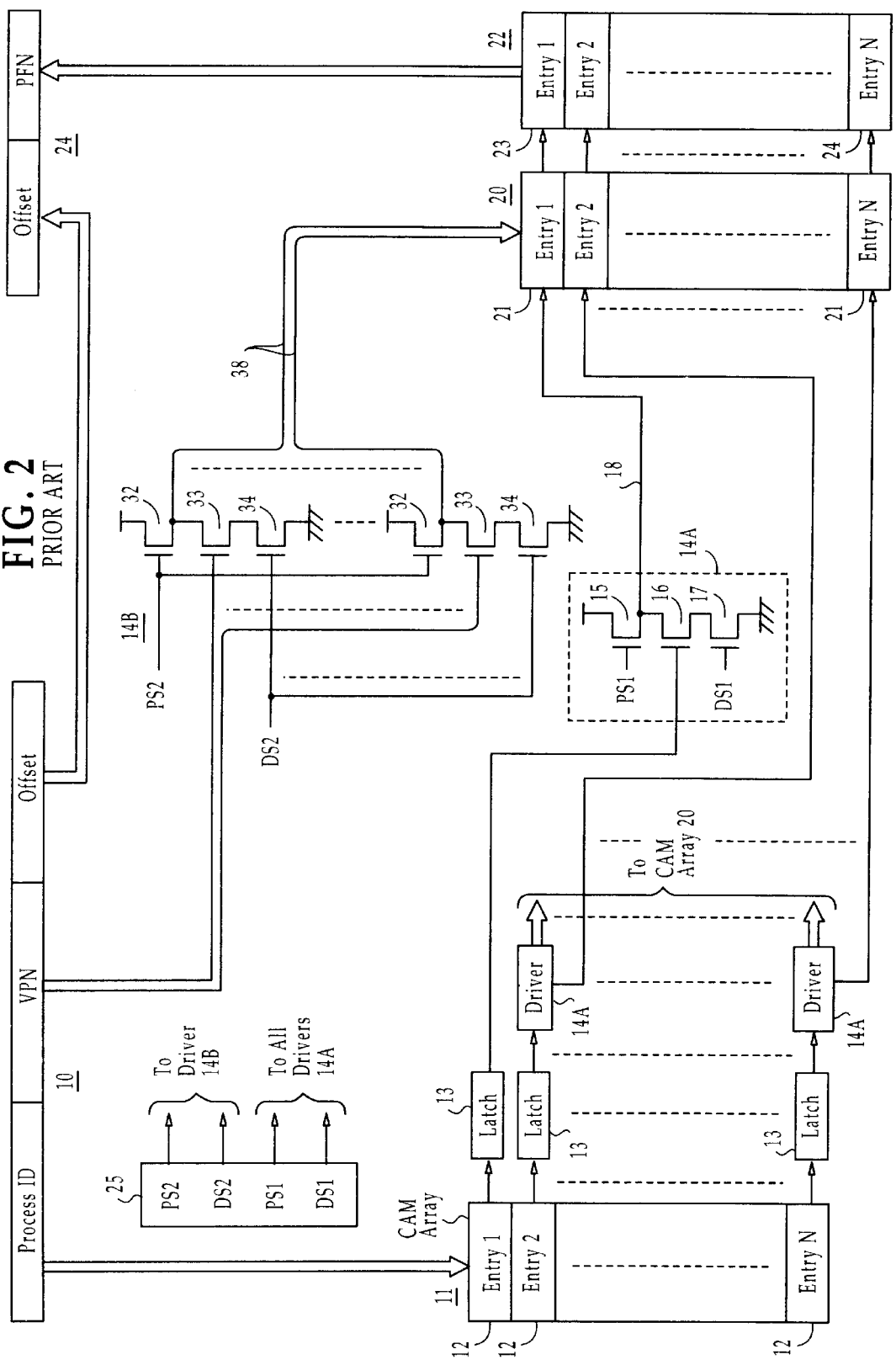
FIG. 2 is a block diagram of a second prior art translation lookaside buffer.

Before proceeding with the description of the present invention, it is useful to describe a prior art address translation buffer, or translation lookaside buffer (TLB) with reference to FIGS. 1 and 2.

In FIG. 1, an input register 10 is provided for temporarily storing a process identifier (PID), a virtual page number (VPN) and an offset value, all of which are supplied from a central processing unit, not shown. The process identifier stored in the input register 10 identifies the process currently being executed by the central processing unit.

In a first prior art translation lookaside buffer, a PID content-addressable memory (CAM) array 11 is connected to the input register 10 for storing a plurality of process identifiers. The PID memory array 11 consists of a plurality of entries 1 to N, each comprising a content-addressable memory 12. All bit lines of the PID memories 12 are connected in parallel to the input register 10 to receive the process identifier of the input register. All PID memories 12 simultaneously compare their process identifier with the new process identifier of the input register 10 for coincidence. When a match is found in at least one of the PID content-addressable memories 12, a low level signal is supplied from such PID memories to a corresponding one of a plurality of latches 13. The outputs of these latches are switched to low voltage level in response to an externally supplied timing signal, while the outputs of the other latches 13 are at high voltage levels.

If no match is detected in all content-addressable memories 12, the write circuit, not shown, is used to store the process identifier of the input register 10 in a vacant PID memory 12 or overwrite a stored process identifier. Concurrently, the write circuit stores the virtual page number of input register 10 in a corresponding memory 21 of the VPN memory array 20 and the physical file number in a corresponding entry 23 of a PFN memory 22.

A plurality of drivers 14 of identical circuit configuration are respectively connected to the latches 13. Each driver 14 includes field-effect transistors 15, 16 and 17 connected in series between a voltage supply and ground. The gate electrode of transistors 15 and 17 are connected to timing control circuitry, not shown, to be impressed with precharge and discharge signals, respectively, while the gate of transistor 16 is connected to the output of the corresponding latch 13. A circuit node between the transistors 15 and 16 is connected by an output line 18 to a corresponding one of a plurality of content-addressable memories 21 of a VPN memory array 20.

These precharge and discharge signals are successively applied to all the drivers in response to specified timing signals, immediately following the detection of a match in the PID memories 12. In response to the precharge signal, all output lines 18 are pulled up to a "precharge" voltage. If a match is detected in one or more of the PID memories 12, the outputs of the corresponding latches 13 switch to low level. Hence, the transistors 16 of the drivers corresponding to the "matched" latches switch to an OFF state, while the transistors 16 of the other drivers are in the ON state.

When the discharge signal is subsequently supplied to all drivers 14, the transistors 17 of all drives switch to the ON state. In response, all output lines 18 are simultaneously pulled down to a "discharge" level except for the output lines whose corresponding transistors 16 are in the OFF state. As a result, the output lines 18 of only those drivers whose corresponding PID memories have detected a new match maintain the precharge voltage. The precharge voltages, thus maintained, are supplied to corresponding VPN memories 21 as "match" signals.

All bit lines of the memories 21 are connected in parallel to the input register 10 to receive the virtual page number from the input register 10. In response to match signals from the drivers 14, the corresponding VPN memories 21 simultaneously compare the VPN from the input register 10 with their VPNs for coincidence.

When a mismatch is detected in VPN memories 21, these memories pull down the "precharge" voltages of the corresponding output lines 18 at an appropriate timing, allowing only one output line where the VPN match is detected to remain at the precharge level. At the same time, the VPN memory 21 where the VPN match is detected delivers an output signal to a corresponding one of a plurality of entries 23 of a physical frame number (PFN) memory 22. A physical frame number corresponding to the VPN of the input register 10 is delivered from this entry 23 to an output register 24. At the same time, the offset value is transferred from the input register 10 to the output register 24. The precharged energy of the output line where the VPN match is detected is discharged at the timing of the next PID matching.

It is seen that all output lines 18 are pulled up to the precharge voltage regardless of the results of comparisons in the PID memory array 11. In response to the subsequent discharge signal, all the output lines 18 are pulled down to discharge level. The precharge energy is thus discharged to ground through the conducting transistors 16 and 17 of mismatched driver. As a result, a substantial amount of energy is dissipated by such drivers. Since this dissipated energy serves no purpose for the VPN memory array 20, a need exists to eliminate such lost energy.

In FIG. 2, a second prior art translation lookaside buffer is shown, in which the drivers identical to the drivers 14 of FIG. 1 are marked 14A. An additional driver 14B is provided, which includes a plurality of sets of transistors 32, 33 and 34, all of which are connected in series between the voltage supply and ground.

From a control circuit 25 precharge and discharge signals PS1 and DS1 are supplied to the transistors 15 and 17 of all drivers 14A and precharge and discharge signals PS2 and DS2 are supplied to the transistors 32 and 34 of the driver 14B at different timing from the timing of signals PS1 and DS1.

In the driver 14B, the gate electrode of each transistor 33 is connected to the input register 10 to receive a respective bit of its stored virtual page number. The circuit nodes between all sets of transistors 32 and 33 vary in potential according to the logical value of the applied VPN bits and form a set of output bit lines 38 for connection to the input bit lines of the VPN memory array 20.

All output bit lines 38 are pulled up to the precharge voltage in response to the precharge signal PS2. When the discharge signal DS2 is then applied to the driver 14B, those output lines 38 whose corresponding transistors 33 are switched to an ON state (i.e., in response to high VPN bits) are pulled down to the discharge level, while other output lines whose corresponding transistors 33 are switched to an OFF state (i.e., in response to low VPN bits) maintain the precharge voltage.

The shortcoming of the second prior art is that, since all output bit lines of the driver 14B are activated by the VPN bits regardless of the result of the comparison in the PID memory array 11, a substantial amount of energy is wasted when no match is detected between two process identifiers.

Figure 3:
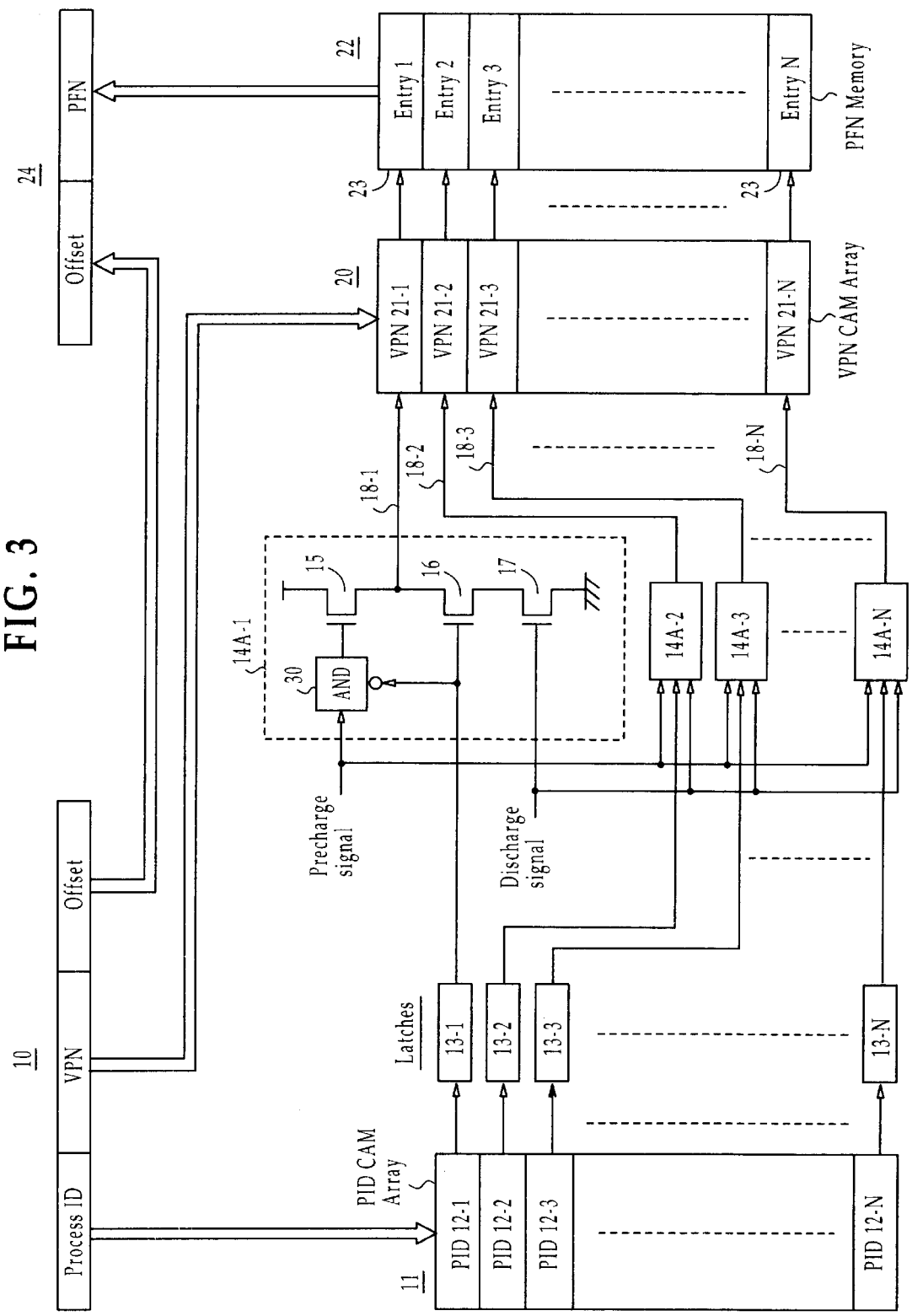
FIG. 3 is a block diagram of a translation lookaside buffer according to a first embodiment of the present invention.

A block diagram shown in FIG. 3 illustrates a first embodiment of the present invention which is an improvement of the prior art of FIG. 1.

In FIG. 3 parts corresponding in significance to those in FIG. 1 are marked with the same numerals as those in FIG. 1 and the description thereof is omitted. The translation lookaside buffer of the first embodiment differs from FIG. 1 by the inclusion of an AND gate 30 in each of the drivers 14A.

The AND gate 30 of each driver receives a precharge signal through a noninverting input of this gate and an output signal from the corresponding latch 13 through an inverting input to produce an output for driving the gate electrode of transistor 15. When a precharge signal is supplied to the AND gate 30 of a driver 14A-1, the AND gate 20 produces a high-level output in response to a low level voltage from the corresponding latch 13-1 when a match is detected in the corresponding PID memory 12-1. Therefore, the output lines 18 of only those drivers 14A are pulled up to the precharge level if a match detected in the corresponding PID memories 12.

As a result, when a match is found in one or more of the PID memories 12, the output lines of the corresponding drivers 14A are pulled up to the precharge level and their corresponding VPN memories 21 are triggered to simultaneously perform a comparison between their virtual page number and the VPN of the input register 10 for coincidence. Except for one output line where a VPN match is detected in the corresponding memory 21, the precharged states of the other output lines are discharged by the VPN memory array 20 in response to the detection of the VPN match.

For PID memories 12 where a match is not detected, the output lines of the corresponding drivers 14A are not pulled up to the precharge level. Thus, the subsequent application of the discharge signal to all drivers has no undesirable effect of consuming energy. Power saving is thus achieved.

The following is a description of the operation of the embodiment of FIG. 3 in a more detail.

Assume that the input register 10 is loaded with new data at time $t_1$ and a match was found in the PID memory 12-3 at the timing of the previous PID matching and a new match is detected simultaneously in the PID memories 12-1 and 12-2 at time $t_2$.

At time $t_3$, a timing signal is applied to all latches 13. Since those latches whose corresponding PID memories are detecting a match change state and produce a low level output, latches 13-1 and 13-2 supplies low level outputs, thus enabling the AND gates 30 of the corresponding drivers 14-1 and 14-2, while the outputs of the other latches are at high voltage level.

In response to a precharge signal applied to all drivers at time $t_4$, the transistors 15 of the drivers 14-1 and 14-2 are turned on to pull up their output line 18-1 and 18-2.

At subsequent time $t_5$, the precharge signal is cancelled and a discharge signal is applied to all drivers. Since the previous match is detected by PID memory 12-3, precharged state is still maintained at the corresponding output line 18-3. Since the output of the latch 13-3 is high, the output line 18-3 is pulled down, discharging the precharged energy.

Since match is detected simultaneously in PID memories 12-1 and 12-2, the VPN memories 21-1 and 21-2 are triggered and the new VPN is compared with their VPNs. If a match is detected in the VPN memory 21-1 and a mismatch is detected in the VPN memory 21-2, the output line 18-2 is pulled down at time $t_6$ in response to an externally supplied discharge control signal. The precharged potential at the output line 18-1 is discharged at time $t_7$ during the next PID matching.

Figure 5:
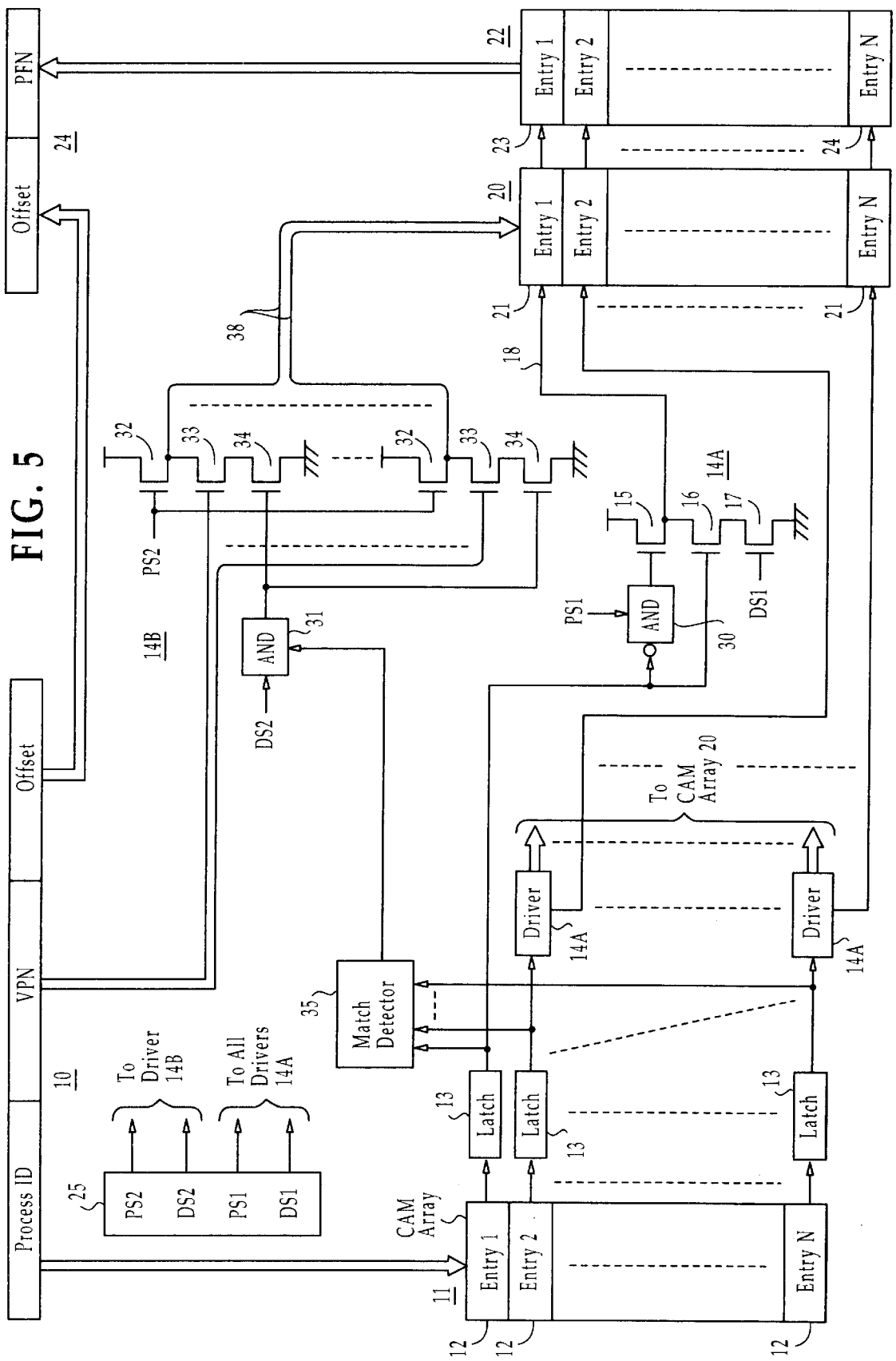
FIG. 5 is a block diagram of a translation lookaside buffer according to a second embodiment of the present invention.

FIG. 5 shows a second embodiment of the present invention which is an improvement of the second prior art of FIG. 2. It is seen that this embodiment differs from FIG. 2 in that each of the drivers 14B additionally includes an AND gate 31.

Figure 4:
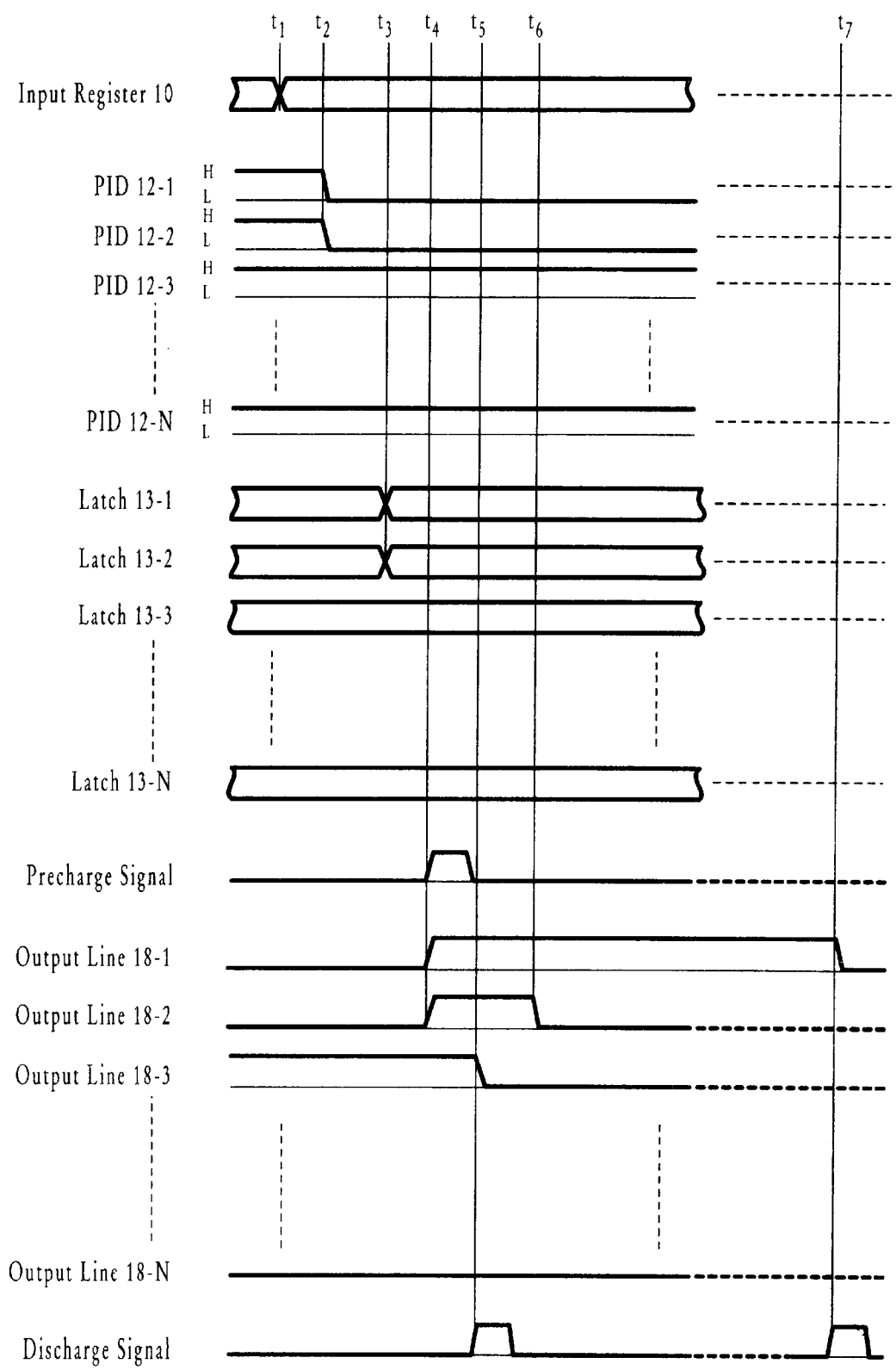
FIG. 4 is a timing diagram of the operation of the embodiment of FIG. 3.

In FIG. 4, a match detector 35 is connected to the outputs of all latches 13 to produce an output signal when at least one match is detected in the PID memories 12.

The AND gate 31 receives a discharge signal DS2 from the control circuit 25 and a match-indicating signal which is produced by the match detector 35 when a transition from the normal high level to low level occurs in one of the latches 13.

Thus, when at least one match is detected in the PID memories 12, the discharge signal DS2 is applied through the AND gate 31 to all transistors 34. Although all output bit lines 38 are pulled up to the precharged voltages, the precharged energy is discharged only when a match is detected in the PID memories 12. When a match is not found in any of the PID memories 12, the discharge action is not performed and the precharged conditions are maintained. Since energy is consumed when charged energy is discharged, the maintained precharge conditions prevent loss of energy.

When a match is detected in one or more of the PID memories 12, discharging occurs only on those output lines 38 where the corresponding transistors 33 are turned ON in response to the high logic values of the VPN bits, thus producing different potentials on all output bit lines 38 depending on the logic values of the VPN bits.

What is claimed is:

1. An address translation buffer comprising:

a first memory array having a plurality of content-addressable memories, each memory storing a previous process identifier for comparing the previous process identifier with a new process identifier which identifies a currently executed process and producing a first output signal when a coincidence is detected between the previous and new process identifiers and a second output signal when said coincidence is not detected;

a plurality of drivers associated respectively with the memories of the first memory array, each of the drivers having an output line and pulling the output line to a first voltage level only when the first output signal from the associated memory coincides with a precharge signal to produce a match signal and pulling the output line to a second voltage level in response to a discharge signal for discharging energy from the output line when the corresponding memory of the first memory array produces said second output signal;

a second memory array having a plurality of content-addressable memories corresponding respectively to the drivers, each memory of the second memory array storing a previous virtual address for comparing the previous virtual address with a new virtual address associated with said new process identifier in response to said match signal of the corresponding driver and producing an output signal when a coincidence is detected between the previous and new virtual addresses; and a third memory for storing a plurality of physical addresses associated respectively with the memories of the second memory array and delivering one of the physical addresses in response to the output signal of the associated memory of the second memory array.

2. An address translation buffer as claimed in claim 1, wherein each of the drivers comprises:

a coincidence gate for producing a coincidence output when the output signal of the associated memory of the first memory array coincides with the precharge signal;

a first transistor responsive to said coincidence output for pulling said output line to said first voltage level;

a second, normally conducting transistor responsive to the output signal of the associated memory of the first memory for changing to a non-conducting state; and a third transistor responsive to said discharge signal for pulling said output line to said low voltage level via the second transistor when the second transistor is conducting.

3. An address translation buffer as claimed in claim 1, further comprising a second driver having a plurality of output bit lines for pulling the output bit lines to different voltage levels corresponding to respective bits of said new virtual address and pulling said output bit lines to said low voltage level only when the output signal of at least one of said memories of the first memory array coincides with said discharge signal, each memory of said second memory array being connected to said plurality of output bit lines for comparing the previous virtual address with the new virtual address represented by said different voltage levels from the second driver in response to said match signal of the corresponding driver.

4. An address translation buffer as claimed in claim 3, wherein said second driver comprises:

a coincidence gate for producing an output signal when the output signal of one of said memories of the first memory array coincides with said discharge signal; and a plurality of sets of first, second and third transistors, each set of first, second and third transistors being associated with a corresponding one of said output bit lines, each of the first transistors being responsive to said precharge signal for pulling the associated output bit line to said first voltage level, each of the second transistors responsive to a corresponding one of the bits of said new virtual address for charging to a conducting state, each of the third transistors being responsive to the output signal of the coincidence gate for pulling the associated output bit line via the second transistor when the second transistor is conducting.

5. An address translation buffer as claimed in claim 2, further comprising:

a second coincidence gate for producing an output signal when one of said memories of the first memory array coincides with said discharge signal; and a plurality of sets of fourth, fifth and sixth transistors, each set of fourth, fifth and sixth transistors being associated with a corresponding one of said output bit lines, each of the fourth transistors being responsive to said precharge signal for pulling the associated output bit line to said first level, each of the fifth transistors being responsive to a corresponding one of the bits of said new virtual address for changing to a conducting state, and each of the sixth transistors being responsive to the output signal of said second coincidence gate for pulling the associated output bit line via the fifth transistor when the fifth transistor is conducting.

6. An address translation buffer comprising:

a first memory array having a plurality of content-addressable memories, each memory storing a process identifier for comparing the process identifier with a process identifier which identifies a currently executed process and producing an output signal when a coincidence is detected between the process identifiers;

a plurality of first drivers associated respectively with the memories of the first memory array, each of the drivers producing a match signal in response to said output signal from the associated memory of the first memory array;

a second driver having a plurality of output bit lines for pulling the output bit lines to different voltage levels corresponding to respective bits of a new virtual address associated with said new process identifier, and pulling said output bit lines to said low voltage level only when the output signal of at least one of said memories of the first memory array coincides with said discharge signal;

a second memory array having a plurality of content-addressable memories corresponding respectively to the first drivers, each memory of the second memory array being connected to said output bit lines of the second driver for storing a previous virtual address and comparing the previous virtual address with a new virtual address represented by said different voltage levels of the second driver in response to said match signal of the corresponding first driver and producing an output signal when a coincidence is detected between the previous and new virtual addresses; and a third memory for storing a plurality of physical addresses associated respectively with the memories of the second memory array and delivering one of the physical addresses in response to the output signal of the associated memory of the second memory array.

7. An address translation buffer as claimed in claim 6, wherein said second driver comprises:

a coincidence gate for producing an output signal when the output signal of one said memories of the first memory array coincides with said discharge signal; and a plurality of sets of first, second and third transistors, each set of first, second and third transistors being associated with a corresponding one of said output bit lines, each of the first transistors being responsive to said precharge signal for pulling the associated output bit line to said first voltage level, each of the second transistors responsive to a corresponding one of the bits of said new virtual address for changing to a conducting state, each of the third transistors being responsive to the output signal of the coincidence gate for pulling the associated output bit line via the second transistor when the second transistor is conducting.

* * * * *